(12) United States Patent
Nakagawa et al.

(10) Patent No.: US 6,339,997 B1
(45) Date of Patent: Jan. 22, 2002

(54) PLASMA PROCESSING APPARATUS

(75) Inventors: Yukito Nakagawa, Tokyo; Ken'ichi Takagi, Fukuoka-ken, both of (JP)

(73) Assignee: Anelva Corporation, Fuchu (JP)

( * ) Notice: Subject to any disclaimer, the term of this patent is extended or adjusted under 35 U.S.C. 154(b) by 0 days.

(21) Appl. No.: 09/453,894

(22) Filed: Mar. 22, 2000

(30) Foreign Application Priority Data

Apr. 12, 1999 (JP) ............................................. 11-103946

(51) Int. Cl.⁷ .............................................. C23C 16/00
(52) U.S. Cl. .................................. 118/723 AN; 156/345
(58) Field of Search ........................ 118/723 I, 723 IR, 118/723 AN, 723 MW, 723 ME, 723 MR, 723 MA; 156/345

(56) References Cited

U.S. PATENT DOCUMENTS

| 5,246,532 A | * | 9/1993 | Ishida ........................ 156/345 |
| 5,556,475 A | * | 9/1996 | Besen et al. .......... 118/723 MP |
| 5,716,451 A | * | 2/1998 | Hama et al. ................. 118/723 |
| 5,879,575 A | | 3/1999 | Tepman et al. |
| 6,220,201 B1 | * | 4/2001 | Nowak et al. ............. 118/723 I |

FOREIGN PATENT DOCUMENTS

| JP | 07-029834 | 1/1995 |
| JP | 07-066144 | 3/1995 |
| JP | 07-224386 | 8/1995 |
| JP | 08-138888 | 5/1996 |
| JP | 08-203695 | 8/1996 |
| JP | 08-325739 | 12/1996 |
| JP | 09-106899 | 4/1997 |
| JP | 09-111460 | 4/1997 |
| JP | 09-186000 | 7/1997 |
| JP | 09-235677 | 9/1997 |
| JP | 09-263949 | 10/1997 |
| JP | 10-041095 | 2/1998 |
| JP | 10-064697 | 3/1998 |
| JP | 10-284299 | 10/1998 |
| JP | 10-298786 | 11/1998 |
| JP | 10-302997 | 11/1998 |

* cited by examiner

*Primary Examiner*—Gregory Mills
*Assistant Examiner*—Luz Alejandro
(74) *Attorney, Agent, or Firm*—Burns, Doane, Swecker & Mathis, LLP

(57) ABSTRACT

A vacuum chamber includes a lower chamber 32, a power lead-in section 34 and an upper chamber 36, these being in communication with one another. A discharge chamber is constituted by the power lead-in section 34 and the upper chamber 36. The lower chamber 32 is made of metal. The power lead-in section 34 is one which has a ring shape, and in which a ring-shaped antenna 46 is embedded in a dielectric element 48. The inner and outer periphery and the bottom surface of the dielectric element 48 are covered by an electrically conductive cover 50. The height position of the top surface of a substrate holder 38 (the surface thereof which carries a substrate 26) is a high position which is higher than the height of the uppermost portion of the power lead-in section 34. In the interior of the discharge chamber discharge is produced and a plasma is generated by high-frequency power supplied from the power lead-in section 34. The substrate 26 is processed by this plasma.

10 Claims, 26 Drawing Sheets

Prior Art

Prior Art

Prior Art

PLASMA PROCESSING APPARATUS

CROSS-REFERENCE TO RELATED APPLICATIONS

Referenced-applications

This application claims the priority of Japanese Patent Application No. 11-103946, filed on Apr. 12, 1999, the entire contents of which is hereby incorporated herein by reference.

STATEMENT REGARDING FEDERALLY SPONSORED RESEARCH

Not Applicable

REFERENCE TO A MICROFICHE APPENDIX

Not Applicable

BACKGROUND OF THE INVENTION

DESCRIPTION OF THE RELATED ART

FIG. 17 is a front-surface sectional view of a conventional plasma processing apparatus possessing an inductively coupled plasma generation system. A vacuum chamber consists of a lower chamber 10 and an upper chamber 12, these two being in communication with one another. The lower chamber 10, which has a generally cylindrical shape, is made of metal. The upper chamber 12 constitutes a discharge chamber, and its sidewall includes a power lead-in window 14 which is made of a dielectric material. The power lead-in window 14 has the shape of a cylinder with, for example, an inner diameter of 362 mm and a height of 100 mm. Around the power lead-in window 14, a generally ring-shaped (loop-shaped) antenna 18 is disposed in a manner such that it surrounds this window 14. The top plate 16 of the upper chamber 12 is made of metal, and is grounded. The interior of the vacuum chamber can be pumped out via an exhaust port 20. Process gas is introduced from a gas delivery system 22 which is connected to the top plate 16. A substrate 26 which is to be processed is set on a substrate holder 24. When the substrate holder 24 is in position for plasma processing, its top surface (the surface on which the substrate 26 is set) is located near the lower end of the upper chamber 12 (the portion thereof which is in communication with the lower chamber 10).

The plasma processing apparatus of FIG. 17 is used in the following manner. Process gas is introduced into the vacuum chamber and maintained at a required discharge pressure of 100 Pa or less. In this state, high-frequency power with a frequency of 13.56 MHz is supplied to the antenna 18, and power is supplied into the upper chamber 12 through the power lead-in window 14. This results in the production of a plasma in the concentrations in the upper chamber 12. Active species in the plasma effect processing (e.g., etching or deposition of a film) of the substrate 26 which is carried by the substrate holder 24.

FIG. 19 is a perspective view of the antenna 18 which is used in the apparatus of FIG. 17. The antenna 18 is essentially ring-shaped and has, in a portion thereof, a cut-out constituting a power supply portion. The shape of the transverse section of the antenna 18 is that of a long, thin rectangle. In its transverse section, the dimension a in the vertical direction is 2 mm, and the dimension b in the horizontal direction is 15 mm. The dimension a in the vertical direction is the dimension measured parallel to the central axis of the cylindrical power lead-in window, and can be called the antenna width. The dimension b in the horizontal direction is the dimension measured normally to the central axis of the power lead-in window, and can be called the antenna thickness.

When high-frequency power with a frequency of 13.56 MHz is used when the antenna 18 is employed for the production of a plasma, a plasma can be produced by an almost perfect inductively coupled mode (see the disclosure of Japanese Laid-open Patent Application No. 8-203695). Since the area of the antenna 18 inner periphery portion which faces the plasma in the upper chamber 12 is small (i.e., since the antenna width a is small), it is possible to achieve plasma formation solely by a practically perfect inductively coupled mode, and so efficient plasma generation is possible.

FIG. 18 is a front sectional view which shows the state at the time of substrate change in the apparatus of FIG. 17. After the substrate holder 24 has been lowered, a gate valve 28 is opened to open a substrate transfer-in/out port 30, and replacement of the substrate 26 is effected using a suitable substrate transfer device (not shown). Since it is difficult to provide the substrate transfer-in/out port 30 in the power lead-in window 14 made of a dielectric, it is necessary to provide it in the lower chamber 10 and effect substrate 26 replacement after lowering the substrate holder 24 as described above.

FIELD OF THE INVENTION

The present invention relates to a plasma processing apparatus, and more particularly it relates to a plasma processing apparatus which has special features by which alternating-current power which produces a plasma is led into a vacuum chamber.

BRIEF SUMMARY OF THE INVENTION

Generally, when plasma processing is effected in a vacuum chamber, a film is deposited on the inner wall surface of the vacuum chamber. For example, when an oxide film on a substrate is etched, a freon-based process gas is used, with the result that an organic film is deposited. Also, in a CVD process, a film is deposited on portions other than a substrate. A film which has been deposited on the inner wall surface of a vacuum chamber is liable to peel off if the temperature of this wall surface changes. This occurs because the coefficient of thermal expansion of the deposited film and the coefficient of thermal expansion of the inner wall surface of the vacuum chamber are different, and, consequently, stress is produced in the deposited film when the temperature of the vacuum chamber inner wall surface changes. The deposited film which has peeled off falls inside the vacuum chamber and becomes a source of dust particle contamination. In order to prevent peel-off of the deposited film due to stress, it is necessary to keep the vacuum chamber heated to a constant temperature.

In the plasma processing apparatus shown in FIG. 17, the power lead-in window 14 is used for leading in high-frequency power. However, since the power lead-in window 14 is made of a dielectric material, it is more difficult to heat it to a constant temperature than it is to thus heat the lower chamber 10 made of metal. Ways of heating the power lead-in window 14 include resistance heating, heating by light, and heating by a liquid medium, etc. However, the high-frequency electric field becomes strong in the vicinity of the power lead-in window 14, and this field becomes disordered by the electric circuit used in resistance heating or light heating using a lamp, in addition to which there is a risk of damage to the electric circuit used for heating, since high-frequency power is superimposed on it. Further, when ordinary quartz glass is used as a dielectric material, the heating efficiency is poor and it is difficult to effect uniform heating in a method of heating using light, since the quartz glass passes hardly any light of the infrared region. In heating using a liquid medium, the procedure is that the power lead-in window is made a double structure, and power lead-in window temperature control is effected by flowing a liquid medium in the space of this structure, but there is a risk of leakage of the liquid, and, in addition, the structure of the power lead-in window is complex. Thus, it is not easy to heat the power lead-in window uniformly. However, if the power lead-in window is not heated uniformly, the risk of a film which has been deposited on the inner wall surface of the power lead-in window peeling off because of stress increases.

Since, accompanying the increase of the area of substrates, there is a trend to increase the area of power lead-in windows, a temperature gradient is liable to be produced in a power lead-in window. This temperature gradient too is the cause of easy peel-off of a deposited film. Further, when a power lead-in window made of a dielectric material is made larger, there is an increased risk of breakage.

Thus, in a conventional plasma processing apparatus, when a film has been deposited on the inner wall surface of the power lead-in window made of a dielectric, it is difficult to prevent peel-off of the deposited film.

The present invention has been devised for the purpose of resolving the above problem, and one of its objects is to provide a plasma processing apparatus in which a film which has been deposited on a power lead-in window does not constitute dust particles affecting a substrate even if it peels off.

Another object of the invention is to provide a plasma processing apparatus in which there are few dust particles and which offers good economic efficiency.

A further object of the invention is to provide a plasma processing apparatus in which it is possible to effect substrate exchange at the location of a discharge chamber.

The plasma processing apparatus of the present invention possesses a special feature in a power lead-in section for leading into a vacuum chamber alternating-current power for the production of a plasma. This power lead-in section comprises a dielectric element, and at least a portion of the dielectric element is exposed in the internal space of the vacuum chamber. The exposed portion of the dielectric element is in a position which cannot be seen from the substrate-carrying surface of a substrate holder located in the position it is in at the time of plasma processing. It is located between the substrate-carrying surface of the substrate holder and an exhaust port of the vacuum chamber.

When the dielectric element portion of the power lead-in section is located in such a position, it is possible for the vacuum chamber portion which can be seen from the substrate to be made of metal material. It is easy to effect heating and maintain the vacuum chamber portion made of metal at a required temperature. Therefore, even if a film is deposited on this vacuum chamber portion, there is little or no production of film stress in the deposited film. Therefore, the deposited film is less likely to peel off from this vacuum chamber portion. A film which has been deposited on a dielectric element portion of the power lead-in section is more likely to peel off due to film stress caused by a temperature change than is a film on the above-noted vacuum chamber portion made of metal. However, since the power lead-in section is in a position which cannot be seen from the substrate and, further it is located downstream of the substrate, a deposited film on the power lead-in section will not fall onto the substrate, even if it becomes detached, and so it has no adverse effect as dust particles on the substrate.

Further, when the vacuum chamber portion which can be seen from the substrate is made of metal, it is easy to provide a substrate transfer-in/out port in this portion. The provision of a substrate transfer-in/out port in this location makes it possible to effect substrate exchange while leaving the substrate holder in the position it is in at the time of plasma processing. Therefore, there is no need for a substrate holder displacement mechanism, and the substrate holder can be simplified.

Further, if the dielectric element of the power lead-in section is used as a portion (a vacuum seal portion) of the vacuum chamber, the area of the dielectric element constituting a portion of the vacuum chamber can be made smaller than that in a conventional apparatus. Therefore, there is less risk of damage to the dielectric element, and safety is improved. Also, it is possible to effect the work of maintenance of the interior of the vacuum chamber simply by opening the vacuum chamber portion made of metal, without removing the power lead-in section. Maintenance work is therefore easy, since there is no need for power lead-in section fitting and detachment work in which care over handling is demanded.

A description of the invention in terms of the direction in which introduced gas flows is as follows. Making a definition of upstream and downstream in the line of flow when gas which has been introduced from a gas delivery system flows through the interior of the vacuum chamber, the substrate-carrying surface of the substrate holder is located upstream of the portion of the dielectric element of the power lead-in section which is exposed in the internal space of the vacuum chamber, and an exhaust port leading to a vacuum pump system is located downstream of this exposed portion.

A typical power lead-in section comprises an essentially ring-shaped antenna, and a dielectric element is present between this antenna and the internal space of the vacuum chamber. High-frequency power is supplied to this antenna. The antenna may be embedded inside the dielectric element or it may be located on the external atmosphere side of a window made of a dielectric. By way of another structure, the power lead-in section may be a rectangular waveguide which is essentially ring-shaped. In this rectangular waveguide, a window made of a dielectric is formed at a surface which is exposed to the internal space of the vacuum chamber, and microwave power is supplied to the rectangular waveguide.

DETAILED DESCRIPTION OF THE INVENTION

Preferred forms of implementation of the present invention will be described with reference to the drawings.

Figure 1:
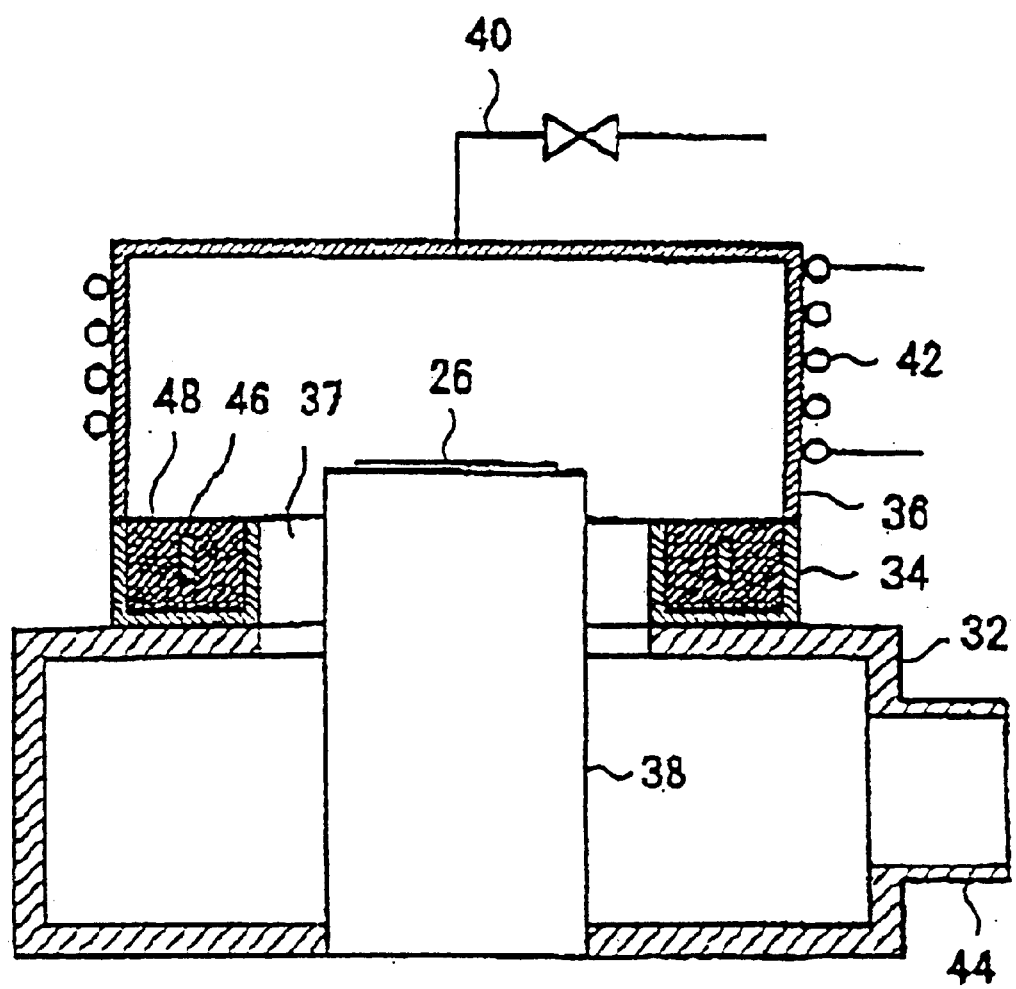
FIG. 1 is a front surface sectional view of a first embodiment of the invention.
Figure 2:
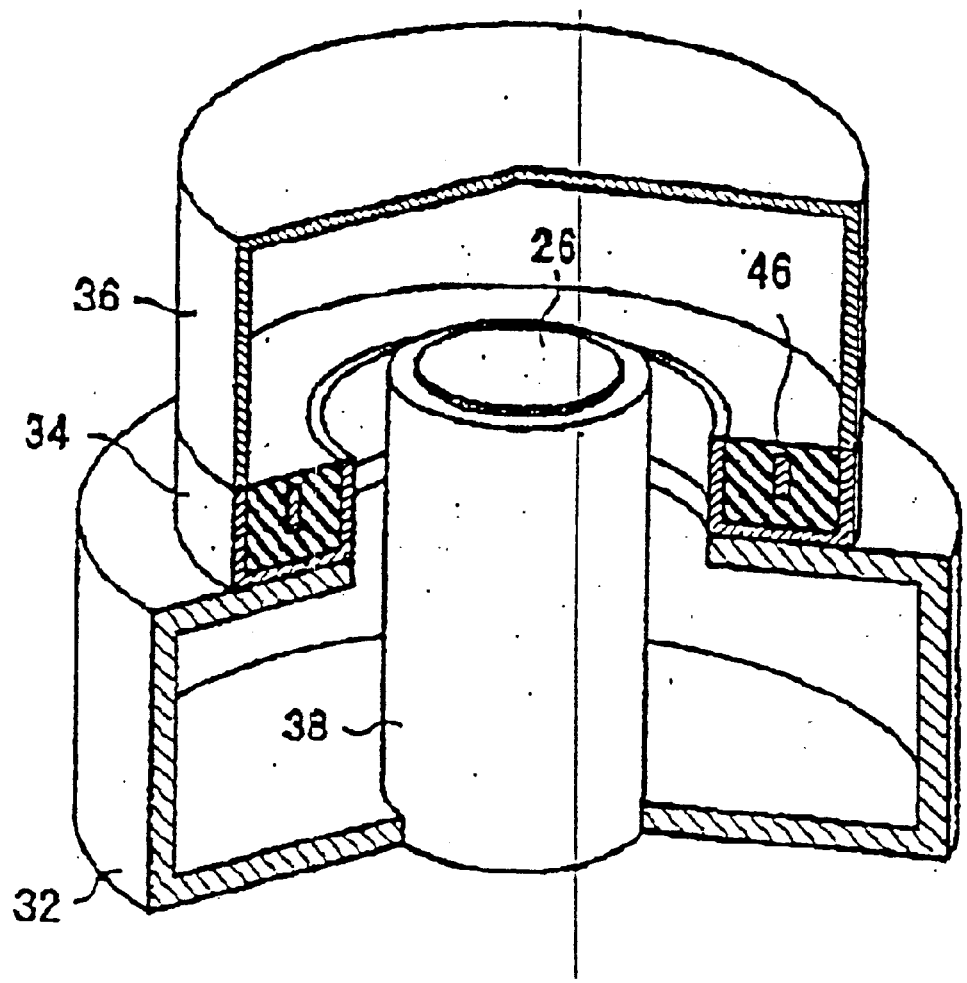
FIG. 2 is a perspective view in which a portion of the plasma processing apparatus of FIG. 1 is shown cut-away.

FIG. 1 is a front surface sectional view of a first embodiment of the present invention, and FIG. 2 is a perspective view which shows this partially cut-away.

A vacuum chamber consists of a lower chamber 32, a power lead-in section 34 and an upper chamber 36, these being in communication with one another. A discharge chamber is constituted by the power lead-in section 34 and the upper chamber 36. The lower chamber 32, which is generally cylindrical, is made of metal. The power lead-in section 34 has a ring shape, and it constitutes the lower portion of the discharge chamber. A substrate holder 38 is installed inside the vacuum chamber, and a substrate 26 which is the object of processing is set on the substrate holder 38. The height position of the top surface of the substrate holder 38 (the surface which carries the substrate 26) is a high position which is higher than the height of the uppermost portion of the power lead-in section 34. In the interior of the discharge chamber, discharge is produced and a plasma is generated by high-frequency power supplied from the power lead-in section 34.

The arrangement may be that a bias voltage is imposed on the substrate holder 38. Any one of three types of bias voltage, which are a direct-current bias voltage alone, an alternating-current bias voltage alone and direct-current bias voltage and alternating current bias voltage used together, can be employed as the bias voltage. Also, the substrate holder 38 may be provided with a temperature regulation system for regulating the substrate temperature.

The upper chamber 36 is made of metal and is at ground potential, as is the lower chamber 32. A gas delivery system 40 is connected to the top plate of the upper chamber 36. Preferably gas blow-out ports in shower head form are provided at the front end of this gas delivery system 40. The gas delivery system 40 may also be connected to the sidewall of the upper chamber 36. A heater 42 may be provided at the external atmosphere side of the sidewall of the upper chamber 36. The heater 42 can effect heating and keep the inner wall surface of the upper chamber 36 at a required temperature, e.g., a suitable temperature of 70° C. or more.

The interior of the upper chamber 36 is connected to the interior of the lower chamber 32 via an annular gap 37 between the power lead-in section 34 and the substrate holder 38. Process gas which has been supplied from the gas delivery system 40 is led into the lower chamber 32 via this annular gap 37, and is discharged from an exhaust port 44. As a result, the interior of the upper chamber 36 is maintained in a required reduced pressure state.

Figure 3:
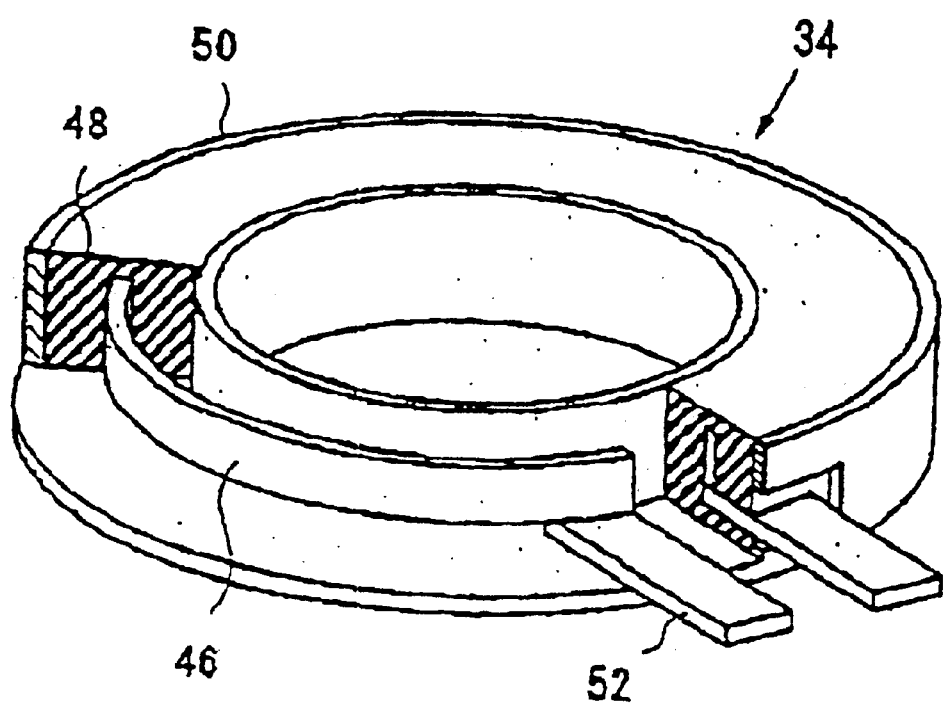
FIG. 3 is a perspective view in which a portion of the power lead-in section which is used in the plasma processing apparatus of FIG. 1 is shown cut-away.

An essentially ring-shaped antenna 46 (possessing a cut-out in one portion) is incorporated in the power lead-in section 34. FIG. 3 is a perspective view in which the power lead-in section 34 is shown partially cut-away. This power lead-in section 34 is one in which the essentially ring-shaped antenna 46 is embedded in a ring-shaped dielectric element 48, e.g., a ceramic such as alumina. The outer surface of the dielectric element 48 is covered by a cover 50 which is electrically conductive, preferably made of metal. The cover 50 covers the inner peripheral surface, the outer peripheral surface and the bottom surface of the dielectric element 48. The top surface of the dielectric element 48 is exposed to the discharge chamber. In a state in which it is assembled as part of the vacuum chamber, the cover 50 is in contact with the upper chamber 36 and lower chamber 32 and is at ground potential. Therefore, the power lead-in section 34 supplies high-frequency power into the vacuum chamber in the direction where the cover 50 is not present, i.e., upwards. There is a cut-out in the antenna 46, and two terminals 52 are connected at the location of this cut-out. These terminals 52 extend radially outwards, and are connected to a power supply for plasma generation. In the vicinity of the terminals 52, the cover 50 is partially removed, so exposing the dielectric element 48 at the outer peripheral surface. The power lead-in section 34 has an inner diameter of 340 mm, an outer diameter of 500 mm, and a height of 80 mm.

Figure 4A:
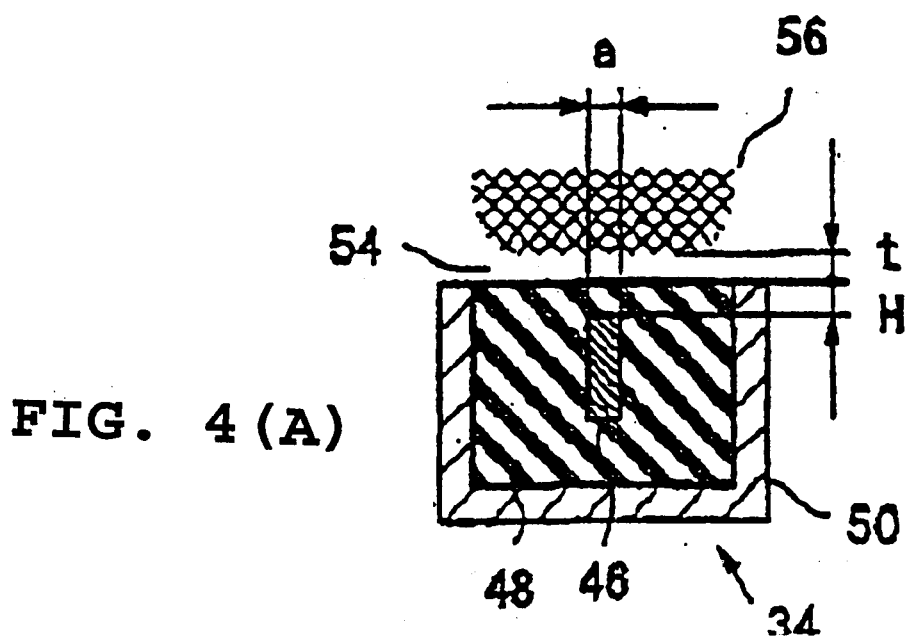
FIGS. 4(A) through 4(H) show cross sections in which the transverse sections of various types of power lead-in sections are shown enlarged.

FIG. 4(A) is an enlarged cross-sectional view of the transverse section of the power lead-in section 34. The distance H between the top surface of the dielectric element 48, the outer surface thereof which faces the internal space of the vacuum chamber, and the upper edge of the antenna 46 affects the discharge characteristics. If the distance H is made short, a strong electric field is produced in the vacuum chamber, and it is therefore possible to effect discharge efficiently. However, there are restrictions such as follows in connection with making the distance H short. When a plasma 56 is produced, a sheath 54 of negative voltage is formed at the top surface of the dielectric element 48. The thickness t of the negative sheath 54 depends on the plasma density. The thickness t affects capacitive coupling between the antenna 46 and plasma 56 and causes the matching conditions to change. If the proportion represented by the thickness t of the negative sheath 54 in the distance between the antenna 46 and plasma 56 (approximately equal to the sum of H and t) is relatively small, then, even if the thickness t varies somewhat, there is only a comparatively small proportional change in the distance (H+t) between the antenna 46 and plasma 56. Therefore, if the distance H is made fairly large, there are no great changes in the matching conditions, even if the thickness t of the negative sheath 54 varies somewhat. It is therefore preferable to make the distance H 5 mm or more. It is noted that, the distance H may be made larger, but only up to the minimum distance between the antenna 46 and the cover 50 (ground potential). This is because, if the distance H is made greater than the minimum distance between the antenna 46 and the cover 50, electrical coupling between the antenna 46 and cover 50 becomes stronger than electrical coupling between the antenna 46 and plasma 56, and it becomes impossible to supply power efficiently to the plasma 56. In practice the distance between the antenna 46 and cover 50 is naturally determined by restrictions relating to the plasma processing apparatus size, and normally it is several tens of mm.

Figure 4B:
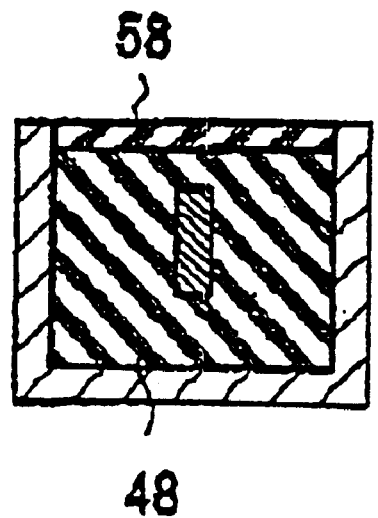

Although the dielectric element 48 is made of an integral element in this embodiment, the arrangement may also be that, as shown in FIG. 4(B), wherein a ringshaped dielectric element 58 is overlaid on the dielectric element 48. This dielectric element 58 serves to ensure the interval for achieving stable discharge.

Returning to FIG. 4(A), the transverse section of the antenna 46 is rectangular, and its dimension a in the horizontal direction is the antenna width. This narrow antenna width portion faces the plasma. For the purpose of efficient production of a plasma, it is preferable that, in the transverse section of the power lead-in section 34 the antenna 46 be located in the central position in the horizontal-direction dimension of the dielectric element 48, (i.e., in the radial direction. In this embodiment, the inner diameter of the antenna 46 is 420 mm, the outer diameter is 422 mm, and the height (the antenna thickness) is 20 mm. The antenna width a is 2 mm. Generally, it is preferable that the antenna thickness be 3 or more times the antenna width. In this embodiment, the antenna thickness is 10 times the antenna width.

The above-described plasma processing apparatus is used in the following manner. In FIG. 1, the interior of the vacuum chamber is pumped out by the vacuum pump system and brought to a set vacuum state. After that, process gas is introduced into the upper chamber 36 from the gas delivery system 40, and is maintained in a set reduced pressure state, e.g., at a pressure of 100 Pa or less. Next, high-frequency power is supplied to the antenna 46 from a power supply for plasma generation and a plasma is produced in the upper chamber 36. The high-frequency power mainly produces a plasma through activation of particles of the process gas in the vicinity of the upper surface of the dielectric element 48. The plasma which has been produced, diffuses in the upper chamber 36, and reaches the outer surface of the substrate 26 on the substrate holder 38. The substrate 26 is processed by the active species in the plasma, i.e., etching is effected or a film is deposited.

In this plasma processing apparatus, only the inner wall surface of the upper chamber 36 made of metal can be seen from the surface of the substrate 26, and the power lead-in section 34 cannot be seen from this surface. Even if a film is deposited on the inner wall surface of the upper chamber 36, the deposited film is not liable to peel off, since the inner wall surface of the upper chamber 36 is kept at a constant temperature. That is, since changes in the temperature of the inner wall surface of the upper chamber 36 are small, there is little production of film stress due to the difference between the coefficients of thermal expansion of the deposited film and the upper chamber, and so the deposited film is not likely to peel off. In contrast, since temperature control is not effected for the power lead-in section 34, a film which is deposited on a surface of the power lead-in section 34 which is exposed to the discharge space, especially the upper surface of the dielectric element 48, is likely to peel off due to film stress. However, the power lead-in section 34 is in a position which cannot be seen from the surface of the substrate 26, and, therefore, even if a deposited film does peel off from the power lead-in section 34, detached film material does not fall onto the surface of the substrate, and so has no adverse effects as dust particles on the surface of the substrate.

In an apparatus in which a high-density plasma is used, as in a plasma processing apparatus, gas molecules which are produced when excessive dissociation of the feed gas occurs sometimes constitute a problem. For example, with C4F8 gas which is used for etching silicon oxide films, the high dissociation degree active species CF and CF2 are produced in large quantities. According to the silicon oxide film etching reaction formula, it is desirable that the C:F component ratio be 1:4, but in high dissociation degree active species, the C:F ratio departs from the ideal ratio for etching, since it is large. Therefore, when the amount of these high dissociation degree active species increases, what in fact results at the time of an etching reaction is the formation of a deposited film with a large C content. Thus, suppression of high dissociation degree active species is linked to a reduction of deposited films on the inner wall surface of the vacuum chamber and results in reduction of dust particles.

High dissociation degree active species can be thought of as being produced by the following mechanism. The vicinity of the upper surface of the dielectric element 48 of the power lead-in section 34 is the region to which high-frequency power is actually supplied, and the electrons of this region possess high energy which exceeds the bonding energy of the process gas molecules. These electrons cause dissociation of the process gas to a high degree, so resulting in the production of high dissociation degree active species. In a plasma, the neutral particle density is greater than the charged particle density. Charged particles diffuse mainly because of the plasma's space potential difference (electrical potential difference), whereas, at a pressure higher than about 1 Pa, neutral particles are subject to the effects of gas flow and pressure differences. In this embodiment, since the power lead-in section 34 is located closer to the exhaust side (the lower side in the drawings) than the substrate-carrying surface (upper surface) of the substrate holder 38, high dissociation degree gas molecules produced in the vicinity of the power lead-in section 34 do not diffuse toward the substrate 26, and are easily exhausted together with the process gas. Therefore, the probability of high dissociation degree gas molecules reaching the substrate 26 is reduced.

Figure 17:
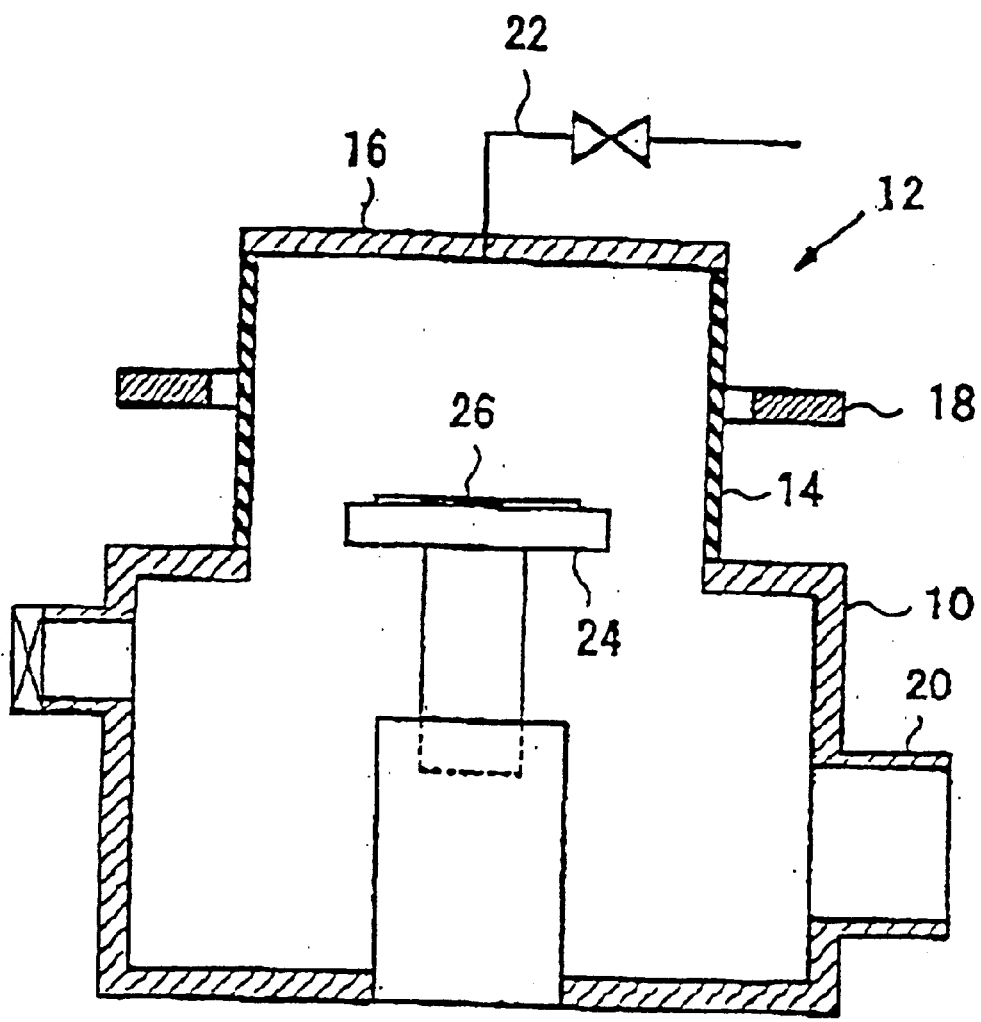
FIG. 17 is a front surface sectional view of a conventional plasma processing apparatus.
Figure 18:
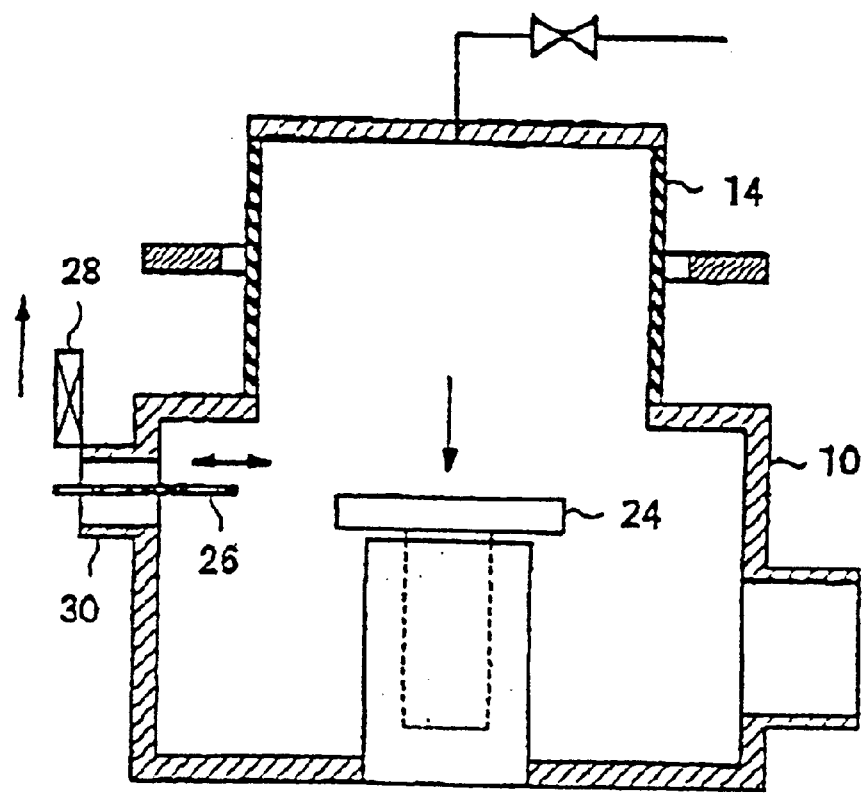
FIG. 18 is a front surface sectional view illustrating the state at the time of substrate exchange in the plasma processing apparatus shown in FIG. 17.
Figure 19:
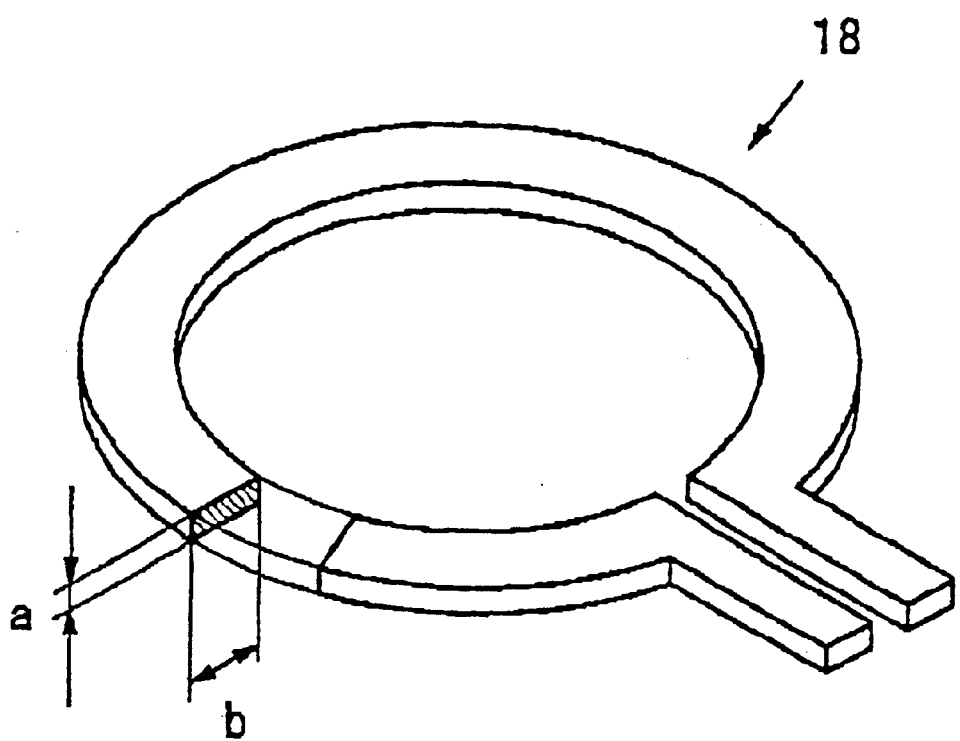
FIG. 19 is a perspective view in which a portion of the antenna which is used in the plasma processing apparatus shown in FIG. 17 is shown cut-away.

In this embodiment, the area of the dielectric element 48 serving jointly as part of the vacuum chamber which is exposed in the vacuum chamber can be made less than in the conventional plasma processing apparatus shown in FIG. 17. Therefore, since the dielectric element serving jointly as a portion of the vacuum chamber can be made smaller, there is less risk of damage to the dielectric element, and safety is improved.

In practical use, maintenance work is needed for a plasma processing apparatus. With the conventional plasma processing apparatus shown in FIG. 17, when maintenance work is conducted, it is necessary to remove and to fit the dielectric power lead-in window 14, and proper care must be taken with the handling of this window. In contrast to this, with the plasma processing apparatus of the embodiment shown in FIG. 1, work on the maintenance of the interior of the vacuum chamber can be conducted simply by removing the upper chamber 36, and so the maintenance work is easy.

In the power lead-in section 34 of this embodiment, the entirety of the upper surface of the dielectric element 48 is exposed in the internal space of the discharge chamber, as shown in FIG. 3. However, there is no objection if the electrically conductive cover 50 further covers the upper surface of the dielectric element 48 to an extent such that there is no decrease in the discharge efficiency. More specifically, the arrangement may be that the inner periphery side and outer periphery side of the upper surface of the dielectric element 48 are covered by the electrically conductive cover 50, and only the portion of the upper surface of the dielectric element 48 which is the central portion thereof in the radial direction is exposed in a ring shape. In this case, the exposure width of the ring-shaped exposed portion of the dielectric element 48 is preferably 2 or more times the antenna width a.

Figure 4C:
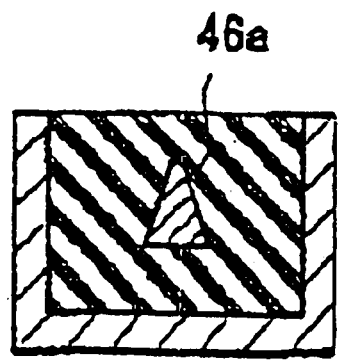

Although, as shown in FIG. 4(A), the shape of the transverse section of the antenna 46 of this embodiment is rectangular, its tip end may also be made of an acute-angled knife shape, as shown in FIG. 4(C). Making it this shape results in still less capacitive coupling between the antenna 46a and the plasma. Since the shape of the antenna does not affect the essence of the invention, it may be modified in a variety of ways, and the advantages of the invention are not lost even if such modifications are made.

Figure 5:
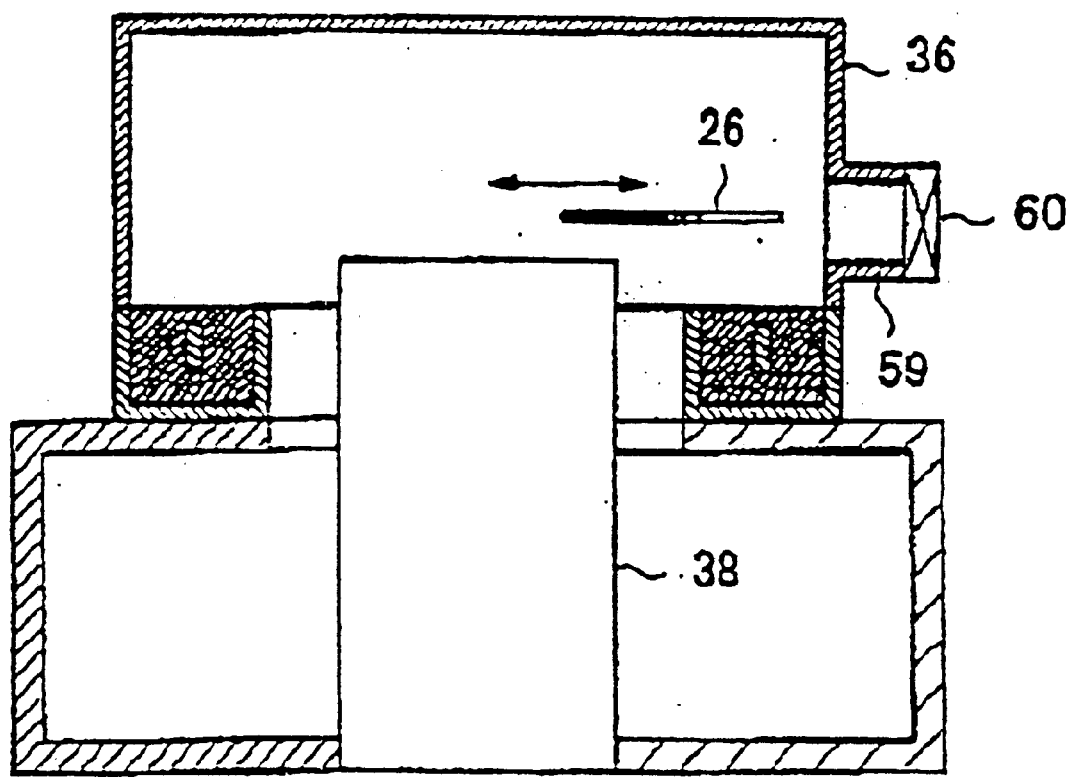
FIG. 5 is a side surface sectional view which is cut-away in order to show a substrate transfer-in/out port in the plasma processing apparatus of FIG. 1.

Next, substrate transfer-in and transfer-out will be discussed. FIG. 5 is a side surface sectional view which is cut away to show a substrate transfer-in and transfer-out port in the plasma processing apparatus of FIG. 1. A substrate transfer-in/out port 59 is provided in the sidewall of the upper chamber 36. Opening a gate valve 60 permits a substrate 26 to be transferred in or out by a suitable substrate transfer-in/out device. Thus, the provision of the substrate transfer-in/out port 59 in the upper chamber 36 makes it possible to transfer the substrate 26 in and out while leaving the substrate holder 38 in the position it is in at the time of plasma processing. Therefore, there is no need for a substrate holder 38 raising and lowering mechanism, and the substrate holder 38 can be simplified.

Figure 6:
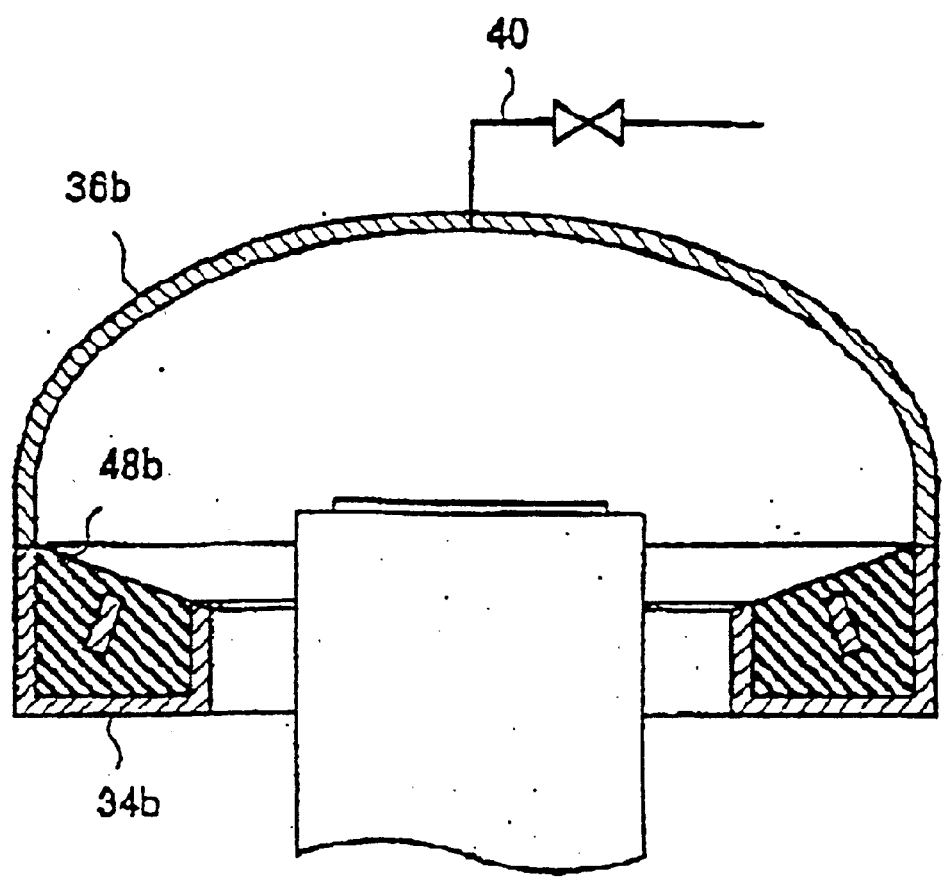
FIG. 6 is a front surface sectional view which shows a discharge chamber and its vicinity in a second embodiment of the invention.

FIG. 6 is a front surface sectional view of a second embodiment of the invention, but shows only the discharge chamber and its vicinity. This second embodiment differs from the first embodiment with regard to the shape of the upper portion of the upper chamber 36b and the structure of the power lead-in section 34b. The parts other than these are the same as in the first embodiment. The upper portion of the upper chamber 36b has a dome shape, i.e., a round roof. In its transverse section, the power lead-in section 34b is inclined in a manner such that its upper surface, i.e., the dielectric element 48b surface) goes downward toward the center, i.e., it is inclined in a direction such that it becomes more distant from the substrate-carrying surface of the substrate holder as it approaches the center. Process gas is introduced in shower form from the gas introduction system 40, and the substrate is always supplied with fresh process gas. Since, as described above, the upper chamber 36b is made in a dome shape and the upper surface of the power lead-in section 34b is inclined, there are no corners which meet at right angles in the internal space of the vacuum chamber. As a result, it is difficult for process gas to stagnate. In contrast to this, in the first embodiment shown in FIG. 1, there are corner portions which meet at right angles at the location where the sidewall and the top plate of the upper chamber 36 meet and the location where the upper surface of the power lead-in section 34 and the sidewall of the upper chamber 36 meet, and so process gas eddies are likely to form in these places. Therefore, stagnation of process gas is likely to occur. Compared to the first embodiment, the flow of process gas is smoother and process gas exchange is effected more efficiently in the second embodiment. There may also be a supplementary gas delivery port in the sidewall of the upper chamber 36b in order to correct the flow of process gas. If this is done, the process gas exchange becomes still smoother. When the flow of process gas is smooth, the amount of film deposited on the inner wall of the vacuum chamber is that much less, and so the amount of dust particles produced is that much less.

Figure 4D:
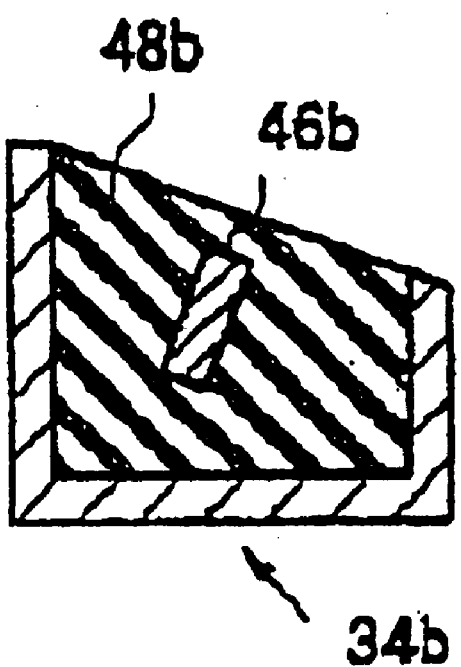

The shape of the transverse section of the power lead-in section 34b which is used in the second embodiment of FIG. 6 is shown enlarged in FIG. 4(D). The upper surface of the dielectric element 48b, i.e., the upper surface of the power lead-in section 34b, slopes downwardly toward the center, i.e., toward the right in the drawing. The shape of the transverse section of the antenna 46b is that of a 2 mm×20 mm rectangle, and its longitudinal direction is normal to the outer surface of the dielectric element 48b. The distance from the upper edge of the antenna 46b to the outer surface of the dielectric element 48b is preferably 5 mm or more, as in the case of FIG. 4(A).

Figure 4E:
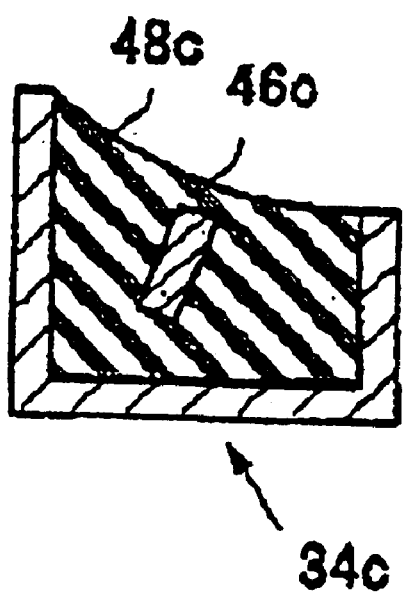
Figure 7:
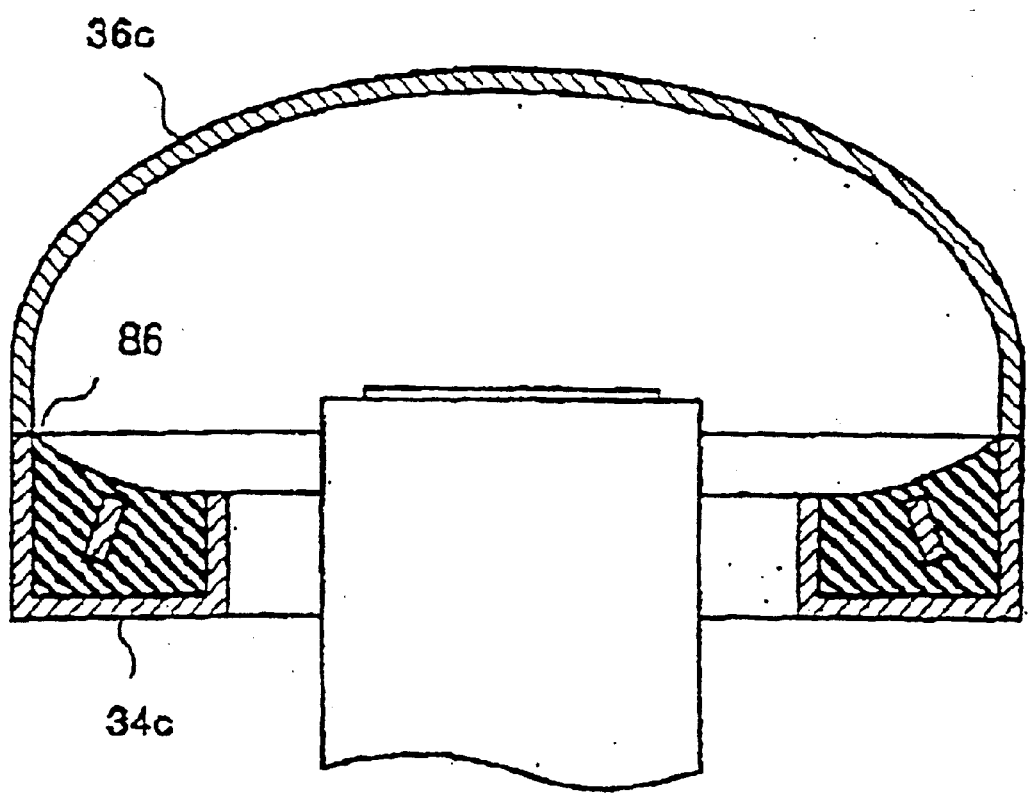
FIG. 7 is a front surface sectional view which shows a discharge chamber and its vicinity in a third embodiment of the invention.

FIG. 7 is a front surface sectional view of a third embodiment of the invention, but shows only the discharge chamber and its vicinity. This third embodiment differs from the second embodiment only with regard to the structure of the power lead-in section. The parts other than these are the same as in the second embodiment. In its transverse section, the power lead-in section 34c defines a downwardly protruding curve (threedimensionally it is a curved surface), and, overall, this curve is inclined downward going toward the center. In this embodiment, the occurrence of eddies is still less than in the second embodiment shown in FIG. 6, and so the flow of process gas is smoother. The shape of the transverse section of the power lead-in section 34c which is used in the third embodiment of FIG. 7 is shown enlarged in FIG. 4(E). The upper surface of the dielectric element 48c, i.e., the upper surface of the power lead-in section 34c, is a curved surface. The shape of the transverse section of the antenna 46c is that of a 2 mm×20 mm rectangle, and its longitudinal direction is normal to the tangent to the outer surface of the dielectric element 48c. The distance from the upper edge of the antenna 46c to the outer surface of the dielectric element 48c is preferably 5 mm or more, as in the case of FIG. 4(A)

As the result of the upper surface of the power lead-in section 34c being made a curved upper surface as in this embodiment, cleaning using a cleaning gas is easy. The time required for cleaning is determined by the cleaning efficiency in the region which is the most difficult for cleaning gas particles to reach, i.e., the corner portion 86 where the upper surface of the power lead-in section 34c and the sidewall of the upper chamber 36c meet. In the third embodiment shown in FIG. 7, since the upper surface of the power lead-in section 34c is made a curved surface with a large curvature, the arrival rate of cleaning gas particles at the corner portion 86 can be made greater than in the second embodiment shown in FIG. 6, and so the cleaning speed can be increased.

Figure 4F:
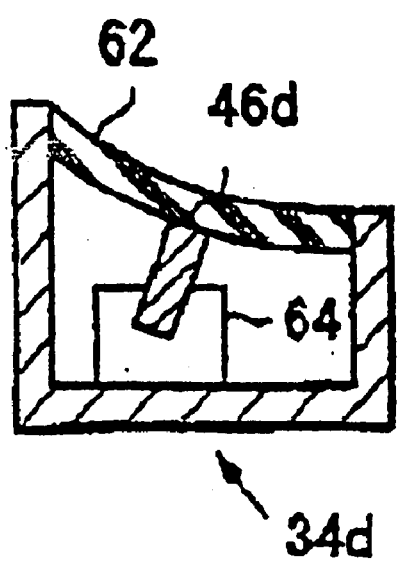
Figure 8:
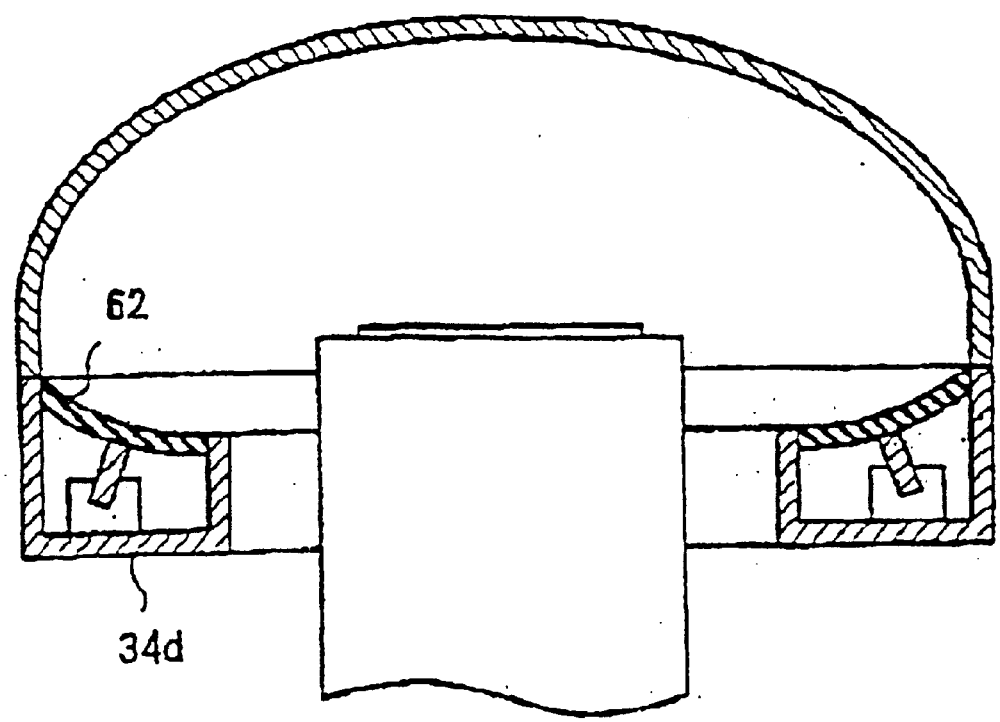
FIG. 8 is a front surface sectional view which shows a discharge chamber and its vicinity in a fourth embodiment of the invention.

FIG. 8 is a front surface sectional view of a fourth embodiment of the invention, but shows only the discharge chamber and its vicinity. This fourth embodiment differs from the third embodiment only with regard to the structure of the power lead-in section. The parts other than that are the same as in the third embodiment. The shape of the upper surface of the power lead-in section 34d is the same as in the third embodiment shown in FIG. 7, and the flow of process gas is therefore good. However, a sheet-like power lead-in window 62 is used instead of embedding an antenna in a dielectric element. The shape of the transverse section of the power lead-in section 34d which is used in the fourth embodiment of FIG. 8 is shown enlarged in FIG. 4(F). The power lead-in window 62 is a curved sheet which defines a downwardly protruding curved surface. Its thickness is, e.g., 5 mm. An antenna 46d is disposed below the power lead-in window 62. Since it is vacuum-sealed by the power lead-in window 62, the antenna 46d is located in the air. The shape of the antenna 46d is the same as that shown in FIG. 4(F). The antenna 46d is supported by pedestals 64 made of a dielectric material at a number of places arranged circumferentially along the power lead-in section. The material used for the pedestals 64 is, e.g., polytetrafluoroethylene (PTFE). When a power lead-in window is used as in this embodiment, the power lead-in section can be manufactured more cheaply than is the case in which an antenna is embedded in a dielectric element.

Figure 9:
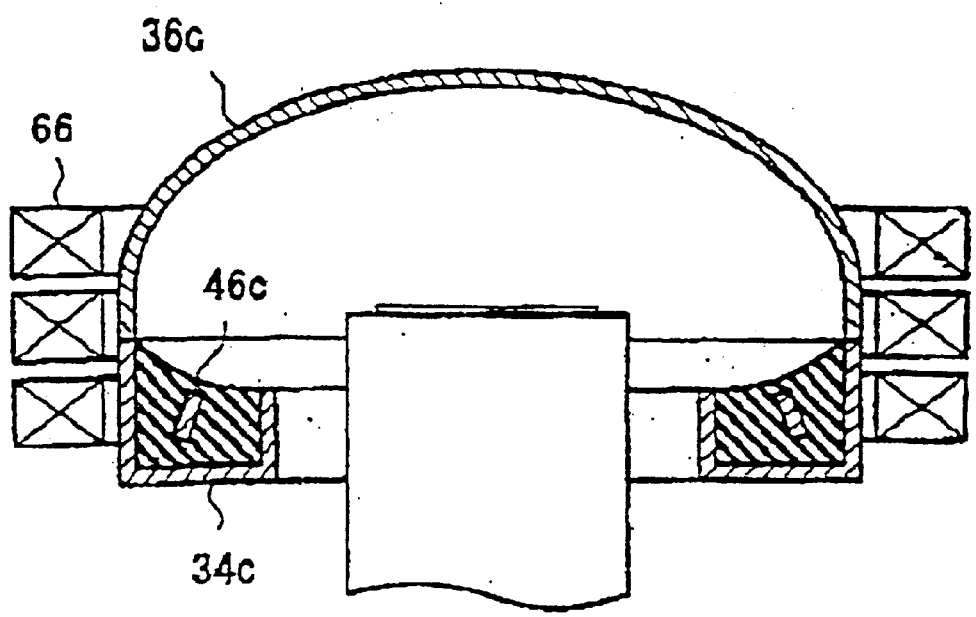
FIG. 9 is a front surface sectional view which shows a discharge chamber and its vicinity in a fifth embodiment of the invention.

FIG. 9 is a front surface sectional view of a fifth embodiment of the invention, but shows only the discharge chamber and its vicinity. This fifth embodiment differs from the third embodiment only in that there is structure for imposing a magnetic field. The parts other than that are the same as in the third embodiment. In this fifth embodiment, a magnetic field imposition structure is installed in a manner such that it surrounds the discharge chamber which is constituted by the upper chamber 36c and power lead-in section 34c. This magnetic field imposition structure is constituted by three coils 66. A ring-shaped region where the magnetic field strength is zero can be produced by means of this magnetic field imposition structure. This region is called an NL, (Neutral Line). The three coils 66 are respectively connected to direct-current power supplies, and regulation of the current that flows in each coil makes it possible to adjust the magnetic field strength and magnetic field direction, and hence to alter the shape and the position of the above-noted NL. Discharge is effected with adjustment to bring this NL, region to the vicinity of the antenna 46c. Imposition of the magnetic field in the discharge space makes it possible to suppress annihilation of plasma electrons at the internal space of the vacuum chamber and maintain the plasma efficiently.

Although an example in which three coils 66 are used to form an NL was given in the fifth embodiment described above, other magnetic field shapes can be formed, and other magnetic field imposition means can be used. For example, it is possible to aim for efficient maintenance of the plasma by forming plural line cusp magnetic fields i.e., packet fields, in the vicinity of the inner wall surface of the discharge chamber.

Figure 10:
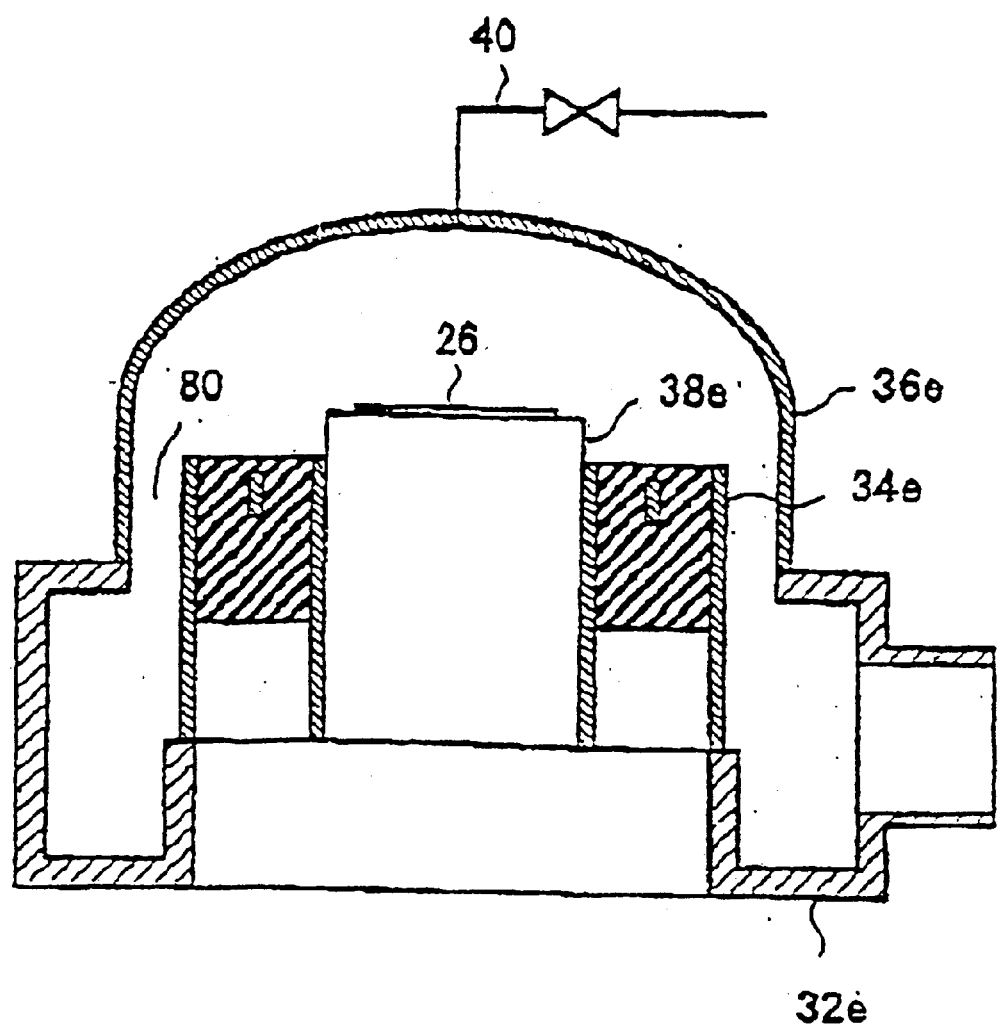
FIG. 10 is a front surface sectional view of a sixth embodiment of the invention.

FIG. 10 is a front surface sectional view of a sixth embodiment of the invention. In the first through fifth embodiments so far, a gap for gas exhaust is formed between the power lead-in section and the substrate holder, but in the sixth embodiment a gap 80 for gas exhaust is formed between the power lead-in section 34e and the upper chamber 36e. The inner peripheral surface of the power lead-in section 34e is fixed to the outer peripheral surface of the substrate holder 38e, and the power lead-in section 34e surrounds the substrate holder 38e without a gap. The outer periphery of the power lead-in section 34e is fixed to the lower chamber 32e. The upper surface of the power lead-in section 34e is located lower than the upper surface of the substrate holder 38a. Process gas is introduced in shower form from the gas delivery system 40. After reaching the substrate 26, the process gas flows from the discharge chamber's central portion toward the outer periphery portion. Then, it is discharged at the outermost periphery portion of the gap. Therefore, gas eddies are less likely to form in the vicinity of the inner wall surface of the discharge chamber, and efficient process gas exchange can be effected.

Figure 4G:
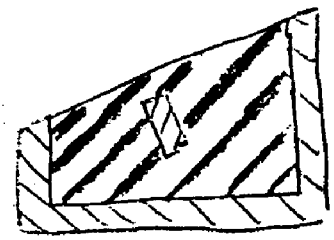
Figure 4H:
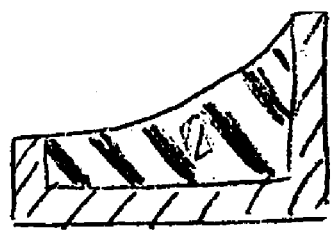
Figure 11:
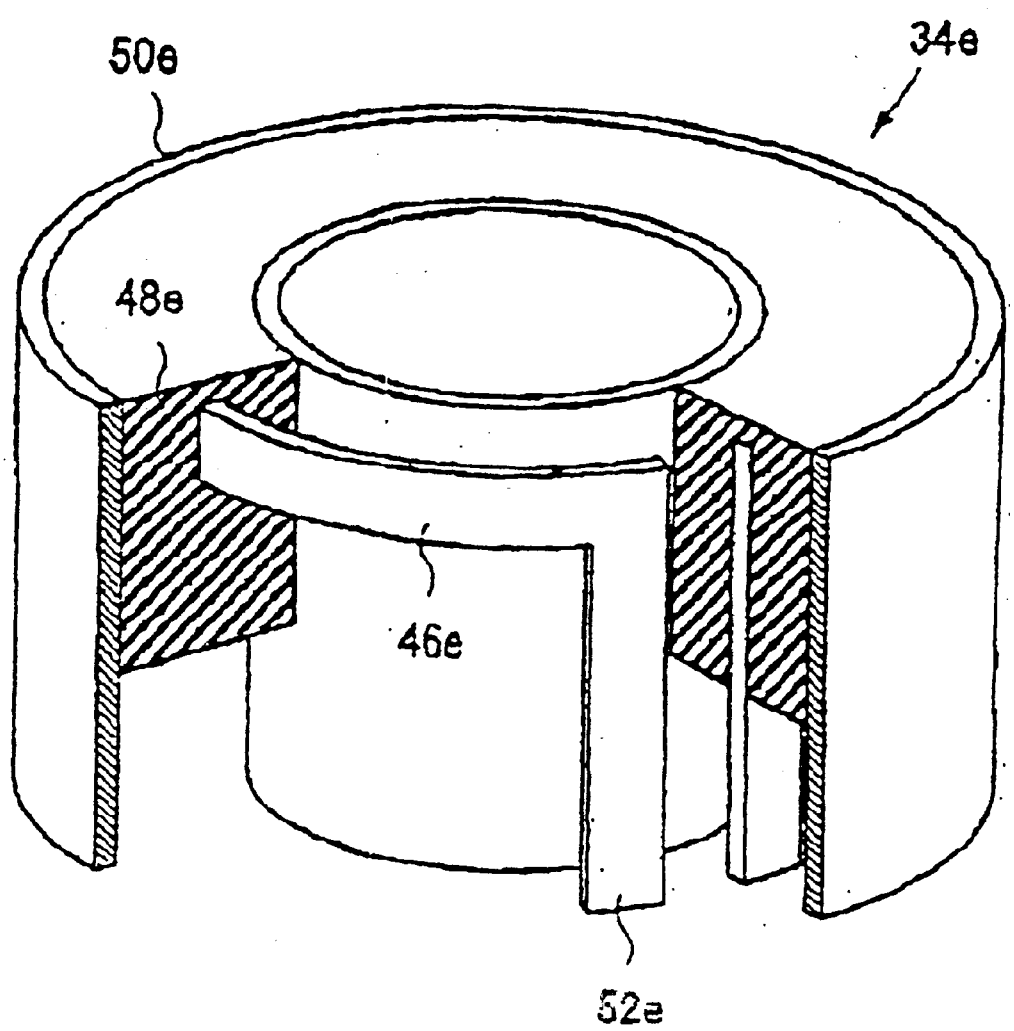
FIG. 11 is a perspective view in which a portion of the power lead-in section which is used in the plasma processing apparatus shown in FIG. 10 is shown cut-away.

FIG. 11 is a perspective view in which a portion of the power lead-in section 34e which is used in the plasma processing apparatus of FIG. 10 is shown partially cut-away. An essentially ring-shaped antenna 46e is embedded in a ring,-shaped dielectric element 48e. The inner peripheral surface and outer peripheral surface of the dielectric element 48e are covered by an electrically conductive cover 50e. This power lead-in section 34e provides a vacuum seal between the dielectric element 48e and cover 50e. A terminal 52e of the antenna 46e projects downward to the outside air side from the dielectric element 48e. High-frequency power is supplied via the terminal 52e to the antenna 46e from below the lower chamber 32e, and is also supplied into the discharge chamber from the upper surface of the dielectric element 48e. In this embodiment, the upper surface of the power lead-in section 34e is made of a horizontal surface, but the upper surface may also be inclined in a manner such that it slopes downward toward the outer side. In this case, the upper surface of the power lead-in section may be a straight line shape or a curved line shape, when viewed along a transverse section. See FIGS. 4(G) and 4(H), respectively.

Figure 12:
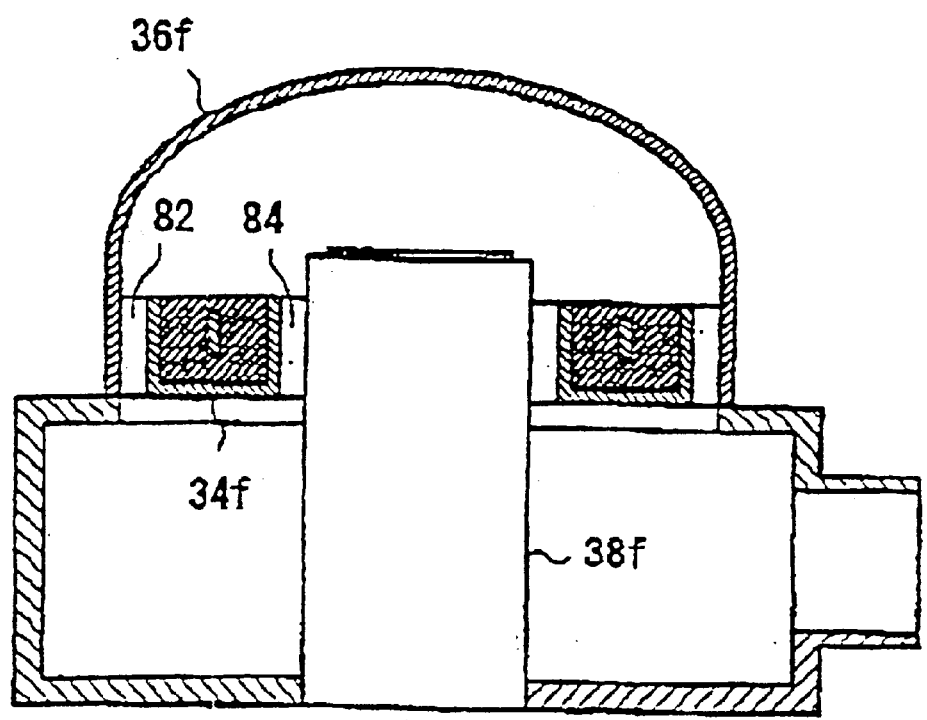
FIG. 12 is a front surface sectional view of a seventh embodiment of the invention.

FIG. 12 is a front surface sectional view of a seventh embodiment of the invention. In this embodiment, a gap 82 is formed between the outer periphery of the power lead-in section 34f and the upper chamber 36f, and, in addition, a gap 84 for gas exhaust is formed between the inner periphery of the power lead-in section 34f and the substrate holder 38f. The outer periphery of the power lead-in section 34f is fixed to the inner wall surface of the upper chamber 36f by plural support members 68 illustrated in FIG. 13. In this embodiment, as in the sixth embodiment described above, it is possible to suppress process gas eddies which are liable to form at the outermost periphery of the discharge section 34f. Further, since gas exhaust can be effected at the inner and outer peripheries of the power lead-in section 34f, exhaust of process gas in the vicinity of the power lead-in section 34f can be effected efficiently.

Figure 13:
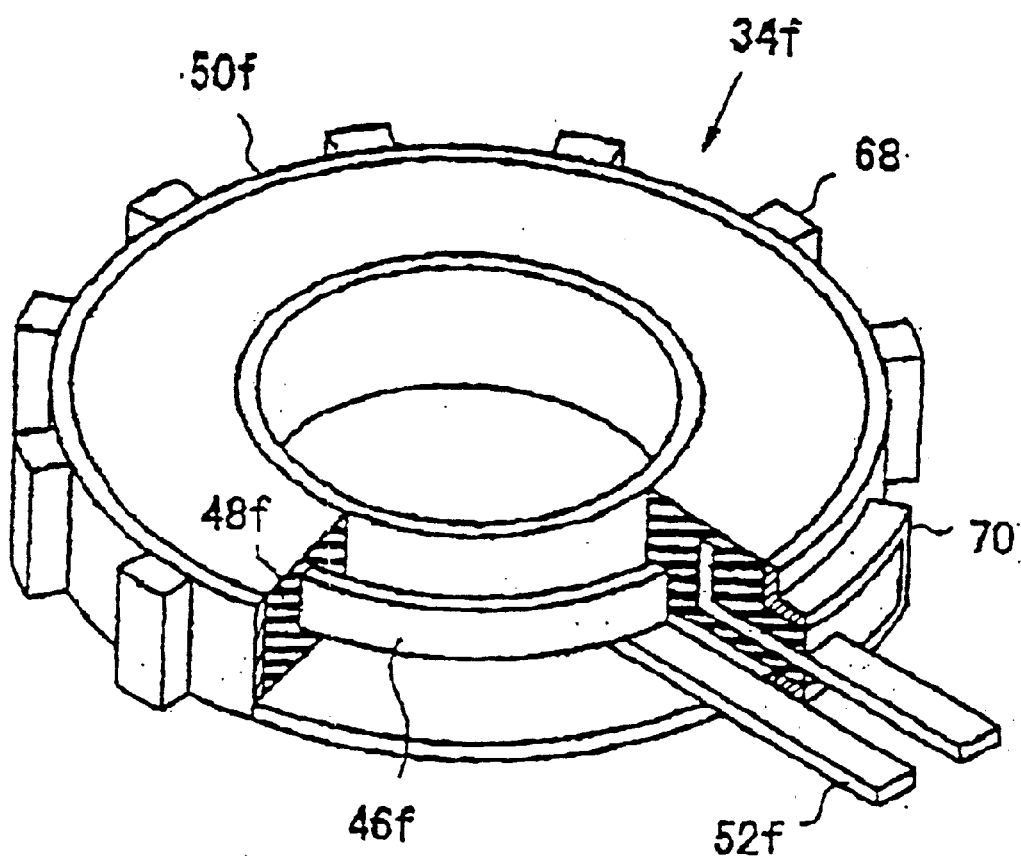
FIG. 13 is a perspective view in which a portion of the power lead-in section which is used in the plasma processing apparatus shown in FIG. 12 is shown cut-away.

FIG. 13 is a perspective view in which a portion of the power lead-in section 34f which is used in the plasma processing apparatus of FIG. 12 is shown partially cut-away. This power lead-in section 34f is one in which an essentially ring-shaped antenna 46f is embedded in a ring-shaped dielectric element 48f. The inner peripheral surface and outer peripheral surface of the dielectric element 48f are covered by an electrically conductive cover 50f. Plural support members 68 are fixed to the outer peripheral surface of the cover 50f, at intervals along the periphery. The outer peripheral surfaces of these support members 68 are fixed to the inner wall surface of the upper chamber 36f. Near the terminals 52f of the antenna 46f, there is a support member 70, and a dielectric element 48f is embedded in this support member 70. Therefore, the terminals 52f are insulated from the upper chamber 36f. Alternatively, the support members 68 may be omitted and the power lead-in section 34f is fixed to the upper chamber solely by the support member 70. In this embodiment, the upper surface of the power lead-in section 34f is made of a horizontal surface, but it is also possible to make the inner periphery edge and outer periphery edge of the upper surface downwardly inclined in straight line form or a curved line form, in order to make the flow of process gas smooth.

In the embodiments described so far, examples of inductive coupling using only one single-coil antenna have been given. However, apart from this, use may be made of a spiral antenna. Also use may be made of plural essentially single-coil antennas which have different diameters.

Although a description of inductively coupled plasma generation means using an antenna was given in the embodiments above, the invention can also be applied to other plasma generation means. An example of a microwave power lead-in section using a rectangular waveguide is given below as one example of such application.

Figure 14:
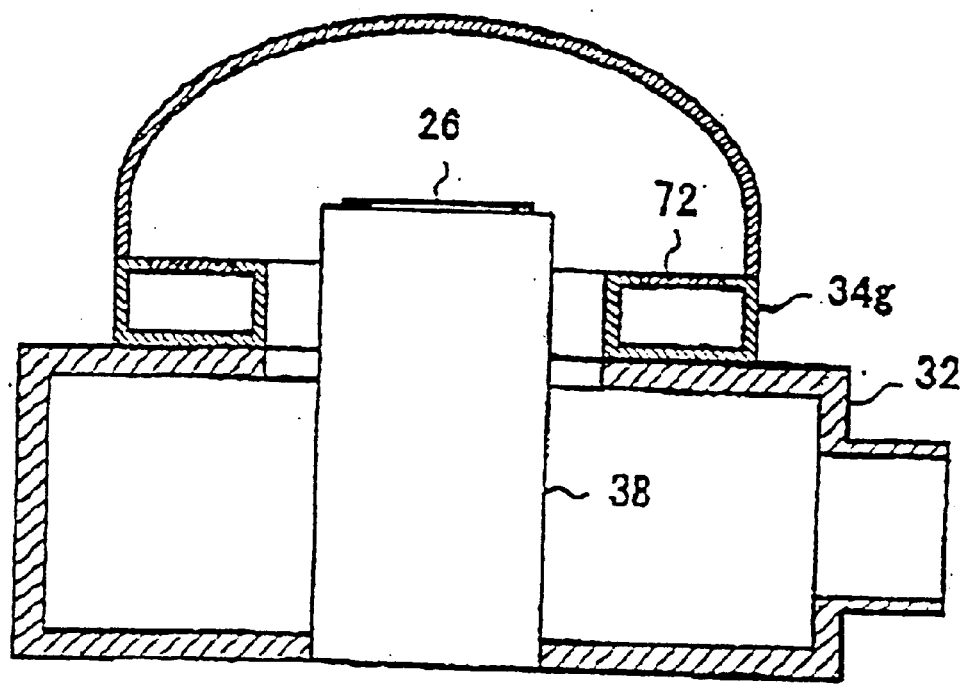
FIG. 14 is a front surface sectional view of an eighth embodiment of the invention.

FIG. 14 is a front surface sectional view of an eighth embodiment of the invention. The structure apart from the power lead-in section 34g is the same as in the second embodiment. The power lead-in section 34g is constituted by a rectangular waveguide which is wound in the form of a circle. As in all the embodiments described so far, this power lead-in section 34g is located in a position which cannot be seen from the substrate 26 on the substrate holder 38.

Figure 15:
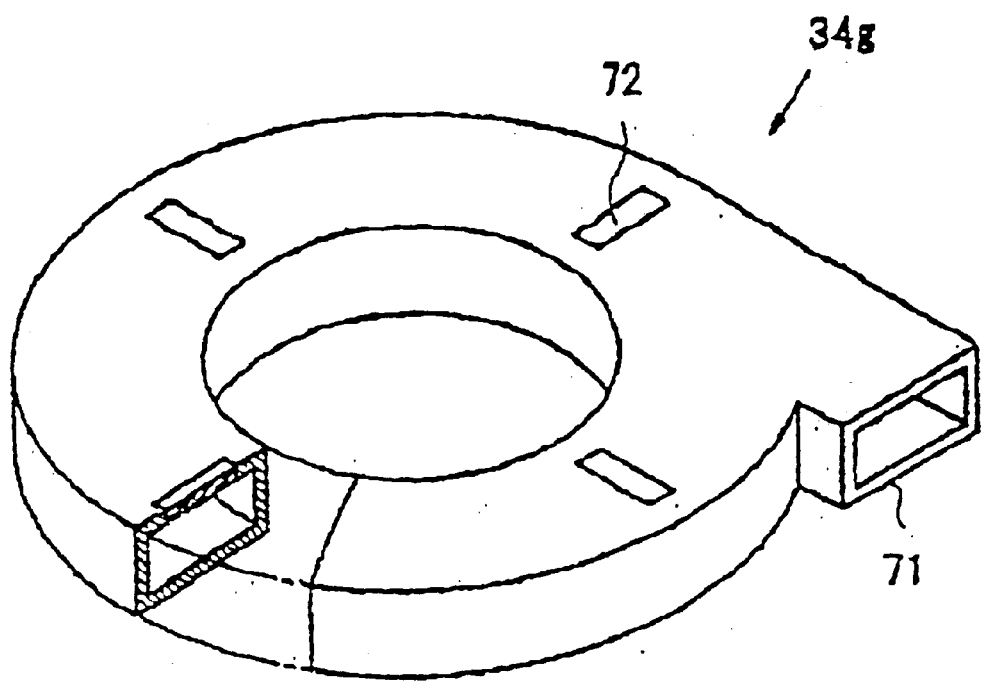
FIG. 15 is a perspective view in which a portion of the power lead-in section which is used in the plasma processing apparatus shown in FIG. 14 is shown cut-away.

FIG. 15 is a perspective view in which a portion of the power lead-in section 34g which is used in the eighth embodiment shown in FIG. 14 is shown cut-away. This power lead-in section 34g is one in which a waveguide which is rectangular in its transverse section is wound in a ring form, and it has an end 71 which is open. When it is connected to the lower chamber 32 (see FIG. 14), the rectangular waveguide is at ground potential. Plural dielectric windows 72 are provided in the top surface of this rectangular waveguide in the outer surface thereof which faces the discharge space. The locations where the dielectric windows 72 are provided are locations where the strength of the standing wave electric field formed in the rectangular waveguide on supply of microwave power is high. There is air inside the rectangular waveguide, and the dielectric windows 72 are vacuum-sealed. When microwave power is introduced into the end 71 of the rectangular waveguide, microwave power is radiated into the discharge chamber from the dielectric windows 72. A plasma is produced in the discharge chamber as a result of this.

In this embodiment, it is possible to effect FCR discharge plasma generation with good efficiency by imposing a steady magnetic field to satisfy ECR discharge conditions. The invention can also be applied to cases in which UHF band high frequencies are used.

Figure 16:
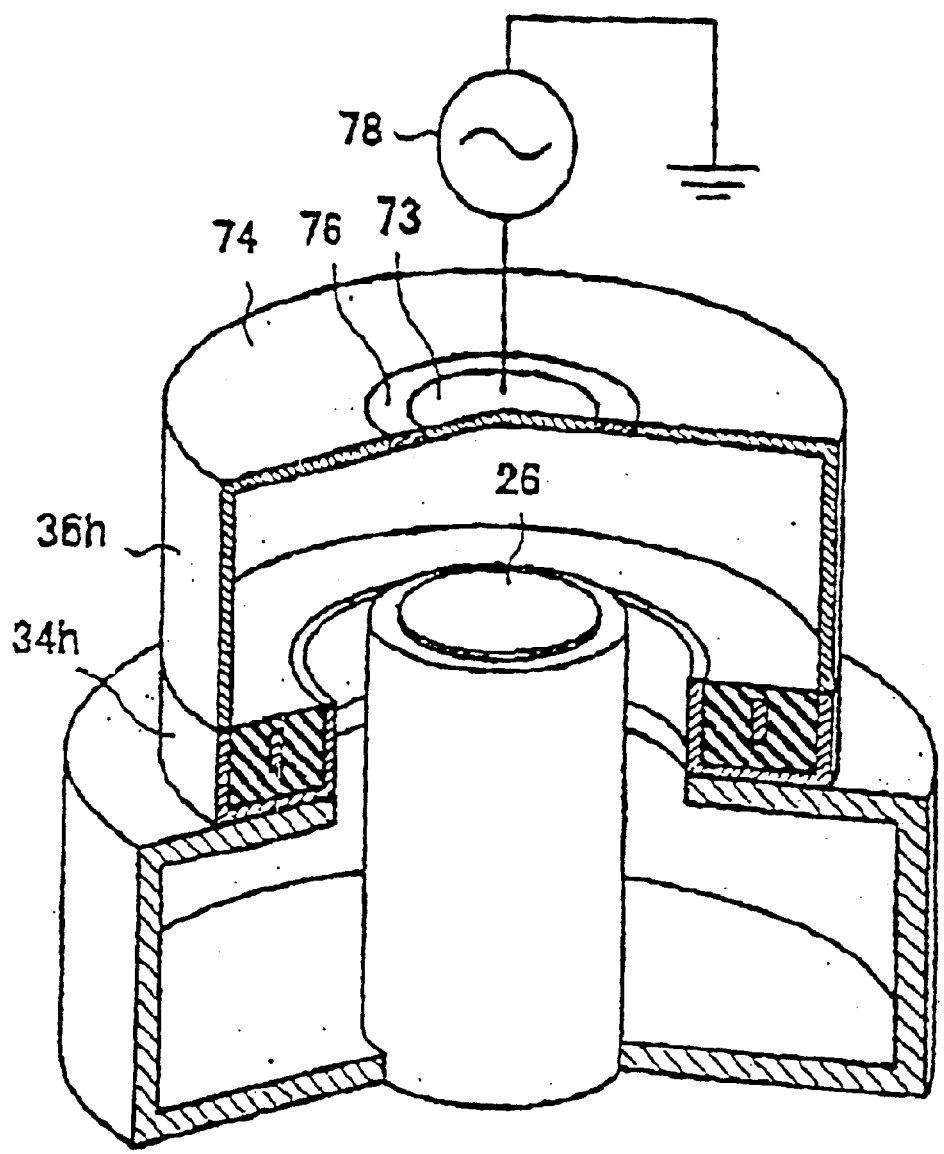
FIG. 16 is a perspective view in which a portion of a ninth embodiment of the invention is shown cut-away.

FIG. 16 is a perspective view in which a ninth embodiment of the invention is shown partially cut-away. This embodiment differs from the first embodiment with regard to the structure of the top plate of the upper chamber 36h the structure apart from that being the same as in the first embodiment. An electrically conductive electrode 73 is provided on the top plate 74 of the upper chamber 36h, and electrical insulation between it and the top plate 74 is provided by an insulator 76. Power is supplied to the electrode 73 from a high-frequency power supply 78 or a direct-current power supply. As a result of this supply of power, the lower surface of the electrode 73 is sputtered, and a thin film is deposited on a substrate 26. This is a well-known sputtering film deposition process. However, it is possible to deposit a film faster than in an ordinary sputtering apparatus since a high-density plasma is produced by the power lead-in section 34h.

Further, since a high-density plasma is produced in the vicinity of the surface of the substrate 26 by the power lead-in section 34h, a large portion of the sputtered particles strikes the substrate after being ionized. Therefore, in cases in which an irregular pattern is formed on a substrate surface, it is possible to deposit a film at a high rate even in the bottom portions of the grooves of this pattern. This is because ionization improves the straight-line flight characteristic of the sputtered particles. To consider, in contrast to this, a conventional magnetron sputtering apparatus, since a high-density plasma is produced in the vicinity of the electrode (target), ionization of sputtered particles takes place in the vicinity of the electrode. In this case, there is failure to achieve advantages such as those in this embodiment, since most of the ionized particles strike the electrode again.

Although an electrically conductive electrode 73 is used in this embodiment, an insulating substance may be overlaid on the electrode 73 for the purpose of depositing an insulating thin film. In this case, a direct-current power supply cannot be used.

In the embodiment of FIG. 16, a suitable magnetic circuit may be provided at the rear surface of the electrode 73, and doing this makes it possible to increase the film deposition rate still more.

In the plasma processing apparatus of the present invention, since the power lead-in section is in a position which cannot be seen from the substrate-carrying surface of a substrate holder, the portion of a vacuum chamber which is visible from a substrate can be made of metal material. Since it is easy to control the temperature of a vacuum chamber portion made of metal, deposited films are less likely to peel off. Also, it is easy to provide a substrate transfer-in/out port in a vacuum chamber portion made of metal, and it is therefore possible to replace substrates while leaving the substrate holder located in the same position it is in at the time of plasma processing.

Further, when the dielectric element of the power lead-in section is used as a portion (a vacuum seal portion) of the vacuum chamber, the area of the dielectric element constituting a portion of the vacuum chamber can be made less than that in a conventional apparatus, and so safety is improved. Also, it becomes possible to effect the work of maintenance of the interior of the vacuum chamber simply by opening the vacuum chamber portion made of metal, without removing the power lead-in section.

Although only preferred embodiments are specifically illustrated and described herein, it will be appreciated that many modifications and variations of the present invention are possible in light of the above teachings and within the purview of the appended claims without departing from the spirit and intended scope of the invention.

What is claimed is:

1. A plasma processing apparatus comprising:
   a vacuum chamber having a gas delivery section and an exhaust port which is connected to a vacuum pump system, and at least a portion of the vacuum chamber is electrically conductive;
   a substrate holder which is installed in an interior space of the vacuum chamber, the substrate holder having a substrate-carrying surface;
   a power lead-in section for leading into said vacuum chamber alternating-current power for producing a plasma with inductive coupling;

the power lead-in section comprises a dielectric element, and at least a portion of said dielectric element is exposed to the interior space of said vacuum chamber; and the exposed portion of the dielectric element is in a position which cannot be seen from the substrate-carrying surface of said substrate holder at the time of plasma processing, and the exposed portion is located between said substrate-carrying surface and said exhaust port.

2. The plasma processing apparatus as claimed in claim 1, in which, making a definition of upstream and downstream going in a direction of flow when gas which has been introduced through said gas delivery section flows through the interior space of said vacuum chamber, wherein said substrate-carrying surface of said substrate holder is located upstream of said exposed portion of said dielectric element, and said evacuation port is located downstream of said exposed portion of said dielectric element.

3. The plasma processing apparatus as claimed in claim 2, wherein:

said power lead-in section includes a substantially ring-shaped antenna, said dielectric element is located between said antenna and the interior space of said vacuum chamber, and further comprising means for supplying high-frequency power to said antenna.

4. The plasma processing apparatus as claimed in claim 1, wherein the vacuum chamber includes an upper chamber and a lower chamber.

5. The plasma processing apparatus as claimed in claim 4, wherein a first gap for gas exhaust is defined between said power lead-in section and said substrate holder, and a second gap for exhaust is defined between said power lead-in section and said upper chamber.

6. The plasma processing apparatus as claimed in claim 1, wherein the substrate carrying surface is above the power lead-in section.

7. The plasma processing apparatus as claimed in claim 1, wherein the power lead-in section is arranged between the substrate carrying surface and the exhaust port.

8. A processing apparatus comprising:

a vacuum chamber having a gas delivery section and an exhaust port which is connected to a vacuum pump system, and at least a portion of the vacuum chamber is electrically conductive;

a substrate holder which is installed in an interior space of the vacuum chamber, the substrate holder having a substrate-carrying surface;

a power lead-in section for leading into said vacuum chamber alternating-current power for producing a plasma;

the power lead-in section comprises a dielectric element, and at least a portion of said dielectric element is exposed to the interior space of said vacuum chamber; and the exposed portion of the dielectric element is in a position which cannot be seen from the substrate-carrying surface of said substrate holder at the time of plasma processing, and the exposed portion is located between said substrate-carrying surface and said exhaust port;

wherein said power lead-in section includes a substantially ring-shaped antenna, said dielectric element is located between said antenna and the interior space of said vacuum chamber, and further comprising means for supplying high-frequency power to said antenna.

9. The plasma processing apparatus as claimed in claim 8, wherein a gap for gas exhaust is defined between said power lead-in section and said substrate holder, and said exposed portion of said dielectric element is inclined in a direction such that, as the exposed portion approaches said gap, the exposed portion becomes more distant from said substrate-carrying surface of said substrate holder.

10. A plasma processing apparatus comprising:

a vacuum chamber having a gas delivery section and an exhaust port which is connected to a vacuum pump system, and at least a portion of the vacuum chamber is electrically conductive;

a substrate holder which is installed in an interior space of the vacuum chamber, the substrate holder having a substrate-carrying surface;

a power lead-in section for leading into said vacuum chamber high-frequency alternating-current power for producing a plasma;

the power lead-in section comprises a dielectric element, and at least a portion of said dielectric element is exposed to the interior space of said vacuum chamber; and the exposed portion of the dielectric element is in a position which cannot be seen from the substrate-carrying surface of said substrate holder at the time of plasma processing, and the exposed portion is located between said substrate-carrying surface and said exhaust port.

* * * * *